(12) United States Patent
Sakaguchi et al.

(10) Patent No.: US 8,906,795 B2
(45) Date of Patent: Dec. 9, 2014

(54) SEMICONDUCTOR DEVICE MANUFACTURING METHOD

(71) Applicant: Fuji Electric Co., Ltd., Kawasaki (JP)

(72) Inventors: Shoji Sakaguchi, Matsumoto (JP); Idayu Sofya, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 14/051,186

(22) Filed: Oct. 10, 2013

(65) Prior Publication Data

US 2014/0120716 A1  May 1, 2014

(30) Foreign Application Priority Data

Oct. 26, 2012  (JP) ................... 2012-236658

(51) Int. Cl.
   *H01L 21/44*   (2006.01)
   *H01L 21/3213*   (2006.01)
   *H01L 21/283*   (2006.01)

(52) U.S. Cl.
   CPC .................. *H01L 21/283* (2013.01)
   USPC ...... 438/597; 438/652; 438/674; 257/E21.174

(58) Field of Classification Search
   CPC ............... H01L 224/1146; H01L 2224/11466; H01L 2924/01029
   USPC .......... 438/597, 652, 674, 678; 257/E21.174; 427/97.7, 97.9, 99.5
   See application file for complete search history.

(56) References Cited

U.S. PATENT DOCUMENTS

2013/0071967 A1* 3/2013 Su et al. ..................... 438/98

\* cited by examiner

*Primary Examiner* — Thanhha Pham

(57) ABSTRACT

A semiconductor device manufacturing method allows stably forming a plating layer at low cost on one main surface side of a substrate, while preventing unintended plating layer deposition on the other main surface side. Emitter and collector electrodes are respectively formed on the front and back surfaces of a semiconductor substrate. A first film is attached to the back surface. A notch portion of the substrate is filled with a resin member. A second film is attached to an outer peripheral portion of the substrate, straddling the substrate from the front surface to the back surface. The first and second films push out air remaining between the first and second films and the substrate. An electroless plating process is carried out while the first and second films are attached to the substrate, thereby sequentially forming a nickel plating layer and a gold plating layer on the front surface side.

13 Claims, 10 Drawing Sheets

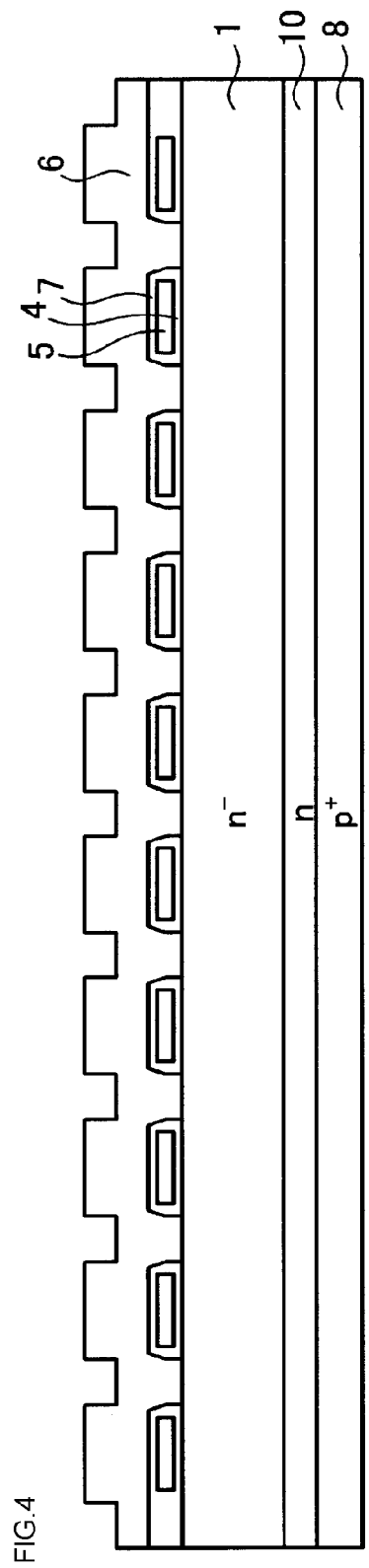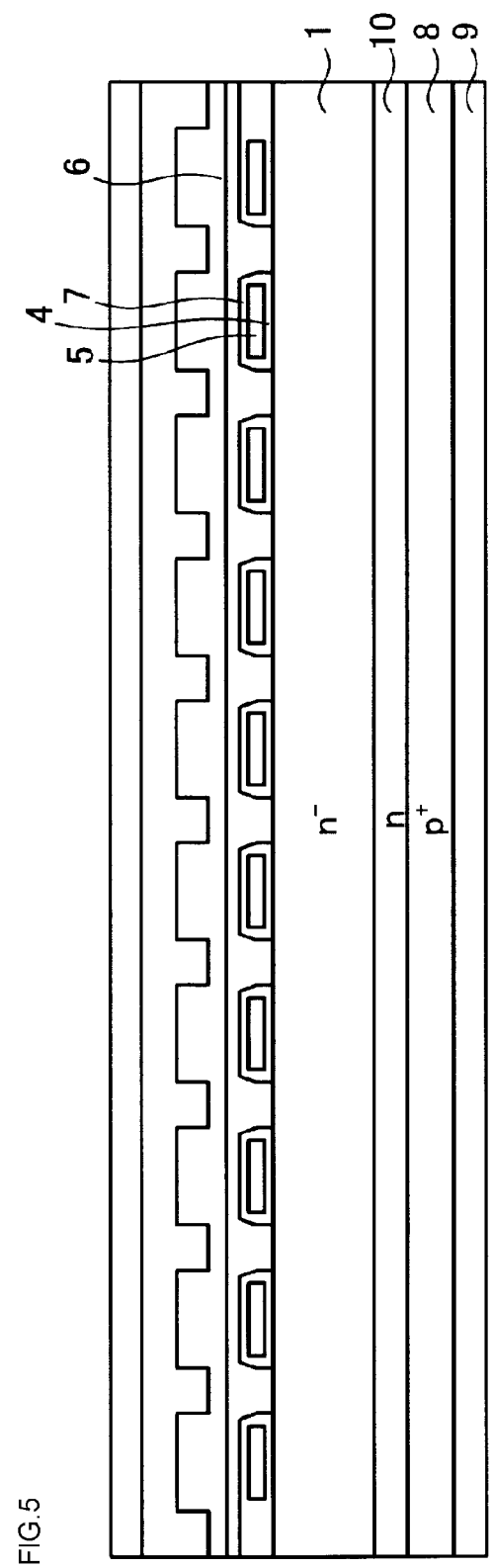

US 8,906,795 B2

SEMICONDUCTOR DEVICE MANUFACTURING METHOD

CROSS-REFERENCE TO RELATED APPLICATIONS

This application claims the foreign priority benefit of Japanese Application No. 2012-236658, filed Oct. 26, 2012, in the Japanese Patent Office, the disclosure of which is incorporated herein by reference.

BACKGROUND

1. Field

Embodiments of the present invention relate to a semiconductor device manufacturing method.

2. Description of the Related Art

Generally, as power semiconductor elements used in a power conversion device or the like, there are elements that carry out a switching operation, such as a power metal-oxide semiconductor field effect transistor (MOSFET) or an insulated gate bipolar transistor (IGBT), a freewheeling diode (FWD) used in combination with these elements, and the like.

For example, an IGBT is a power semiconductor element having the high speed switching characteristics and voltage drive characteristics of a MOSFET and the low on-state voltage characteristics of a bipolar transistor. Hereafter, a description will be given of structures of an IGBT. Structures of an IGBT include a punch through (PT) type, a non-punch through (NPT) type, a field stop (FS) type, and the like.

A PT type IGBT is fabricated (manufactured) using an epitaxial substrate wherein an n-type buffer layer and an n$^-$ type active layer are epitaxially grown on a surface of a p$^+$ type semiconductor substrate. For example, in the case of an element in a 600V breakdown voltage class, an active layer thickness of in the region of 100 μm is sufficient, and the total thickness of the epitaxial substrate including the p$^+$ type semiconductor substrate is in the region of 200 to 300 μm. Also, as a PT type IGBT is fabricated using an epitaxial substrate, the cost is high.

Meanwhile, with regard to an NPT type IGBT and FS type IGBT, there is known a method that uses a semiconductor substrate (hereafter referred to as an FZ substrate) formed by being cut out from a semiconductor ingot formed using a floating zone (FZ) method. Whichever semiconductor substrate of the epitaxial substrate and FZ substrate is used, these IGBTs are such that a low-dose, shallow p$^+$ type collector layer is formed on the substrate back surface side. For example, a description will be given of the configurations of an NPT type IGBT and an FS type IGBT.

FIG. 12 is a sectional view showing the configuration of a heretofore known NPT type IGBT. As shown in FIG. 12, an n$^-$ type semiconductor substrate formed of an FZ substrate forms an n$^-$ type drift layer 101, and a p$^+$ type base region 102 and n$^+$ type emitter region 103 are selectively provided on one main surface (hereafter referred to as the front surface) side of the n$^-$ type drift layer 101. The n$^-$ type drift layer 101 has a function as an active layer. A gate electrode 105 is provided across a gate oxide film 104 on the front surface of the substrate. An emitter electrode 106 is in contact with the n$^+$ type emitter region 103 and p$^+$ type base region 102, and is isolated from the gate electrode 105 by an interlayer dielectric film 107. A p$^+$ type collector layer 108 and a collector electrode 109 are provided on the other main surface (hereafter referred to as the back surface) of the n$^-$ type semiconductor substrate.

FIG. 13 is a sectional view showing the configuration of a heretofore known FS type IGBT. As shown in FIG. 13, the element structure on the front surface side of the FZ substrate is the same as the element structure of the NPT type IGBT shown in FIG. 12. The FS type IGBT differs from the NPT type IGBT in that an n-type buffer layer 110 is provided between the n$^-$ type drift layer 101 and p$^+$ type collector layer 108 on the back surface side of the FZ substrate. By using an FZ substrate in the NPT type IGBT and FS type IGBT in this way, the total thickness of the substrate is considerably less than that in a PT type IGBT.

Specifically, in the case of the FS type IGBT, the total thickness of the substrate is 50 μm to 200 μm. More specifically, for example, in the case of a power semiconductor element in a 600V breakdown voltage class, the total thickness of the substrate is in the region of 80 μm. By using an FZ substrate, it is possible to control the hole injection ratio by adjusting the total thickness of the substrate, because of which it is possible to realize high speed switching without carrying out lifetime control. Also, as an FZ substrate is less expensive than an epitaxial substrate, cost decreases.

When mounting this kind of power semiconductor element (chip), each electrode of the power semiconductor element is connected to a circuit pattern on an insulating substrate, a plate-like conductor (hereafter referred to as an external terminal), or the like. For example, there is a heretofore known method whereby the collector electrode (back surface electrode) on the back surface side of the substrate is connected by solder joining to an external terminal, while the emitter electrode (front surface electrode) on the front surface side of the substrate is connected to an external terminal by wire bonding using aluminum wire. Also, a method whereby the front surface electrode is joined by solder joining to an external terminal has been proposed in order to increase the mounting density of a module package, improve current density, reduce wiring capacity in order to increase switching speed, improve the semiconductor element cooling efficiency, and the like.

By connecting the front surface electrode of the power semiconductor element and the external terminal by solder joining rather than wire bonding, it is possible to eliminate the space needed for wire routing when wire bonding, and thus possible to greatly reduce the capacity of the module package. Also, it is possible to greatly reduce the wiring capacity of a joint portion between the power semiconductor element and external terminal.

Furthermore, by solder joining the front surface electrode of the power semiconductor element and the external terminal, the current limitation caused by the wire resistance that occurs in wire bonding is eliminated, because of which it is possible to improve the current density. Also, as each of the front surface electrode and back surface electrode is connected to an external terminal (for example, a copper plate), it is also possible to cool the power semiconductor element directly with cooling water or the like, and it is thus possible to considerably improve the power semiconductor element cooling efficiency.

In order to solder join the front surface electrode of the power semiconductor element and the external terminal, it is necessary to provide a metal layer (for example, nickel) with good solder wettability on the surface of the front surface electrode. Forming a metal layer with good solder wettability on the surface of the front surface electrode using a plating process has been proposed as a method of solder joining the front surface electrode of the power semiconductor element and the external terminal (for example, refer to JP-A-2005-19798).

For example, an electroless plating method is known as a method of forming a metal layer using a plating process. However, when a dicing line (semiconductor substrate cutting reserve) is exposed on the front surface of the semiconductor substrate, a plating layer is also formed on the dicing line surface by the electroless plating process, and the front surface electrode potential and substrate potential become the same across the plating layer. Also, there is concern that a plating layer will also be formed on the outer peripheral portion, in which no element structure is to be formed, of the semiconductor substrate (wafer), and furthermore, that a plating layer will be formed as far as the back surface of the semiconductor substrate.

When a plating layer is formed as far as the outer peripheral portion or back surface of the semiconductor substrate, there is a problem in that variation occurs in a plating layer formed on the front surface side of the semiconductor substrate. A method whereby a dicing line on the front surface side of a substrate, or a substrate side surface, is covered with a dielectric film or resin has been proposed as a method of suppressing this kind of plating layer variation (for example, refer to JP-A-2006-156772 and Japanese Patent No. 3,831,846).

However, even when covering the dicing line with a dielectric film or resin, for example, zinc residue remaining due to insufficient cleaning after a zinc substitution process during double zincate treatment carried out as preprocessing when forming a nickel layer using an electroless plating process (hereafter referred to as an electroless nickel plating process), suspended solids in the plating solution, and the like, become a nucleus, and there is concern that a plating layer will be formed on the semiconductor substrate back surface side, which is not activated with respect to the plating solution.

It may happen that a plating layer (for example, a nickel layer) anomalously deposited on an originally unintended portion (for example, the back surface electrode of the semiconductor substrate) in this way becomes detached due to oscillation of the semiconductor substrate in the plating solution, and falls into the plating solution. Then, the fallen plating layer (nickel layer) becomes a nucleus, and continuous deposition of the metal (nickel) configuring the plating layer begins in the plating tank, because of which the concentration of the metal configuring the plating layer (the nickel concentration) in the plating solution decreases.

An electroless plating process is such that the plating processing time is determined from a deposition speed measured in advance. Because of this, when the composition of the plating solution changes, the electroless plating process is carried out at a deposition speed different from the deposition speed measured in advance, and the desired thickness of plating layer can no longer be obtained in the predetermined plating processing time. Consequently, a problem occurs in that the plating tank has to be cleaned and the plating solution changed.

In order to eliminate this kind of problem, a method whereby the semiconductor substrate is fixed and a plating process carried out using a dedicated jig with a structure such that the plating solution does not reach the back surface side of the substrate has been proposed as a method of forming a plating layer on only the front surface side of the semiconductor substrate. Also, a method whereby a protective film is formed by applying a resist to a portion on which no plating layer is to be formed, such as the back surface or side surface of the semiconductor substrate, and an electroless plating process subsequently carried out, has been proposed as another method.

Also, a method whereby an adhesive solution is applied to the surface on the side of the semiconductor substrate opposite to the surface to be processed and, after the fluidity of the adhesive solution is reduced by preliminary drying, thus enabling the maintaining of form as an adhesive layer, a support plate is attached, has been proposed as a method of carrying out a predetermined process in a condition wherein the surface of the semiconductor substrate is partially covered (for example, refer to JP-A-2005-191550).

Also, a method whereby a PET substrate is attached to the surface on a surface side element structure portion side of a semiconductor wafer, after which a back surface structure is fabricated on the back surface of the semiconductor wafer with the PET substrate still in the attached condition, has been proposed as another method (for example, refer to JP-A-2007-317964).

Also, a method whereby an adhesive layer is formed on the surface on the side of a semiconductor wafer opposite to the surface to be processed, after which a light permeable supporting body, such as glass on which a photothermal conversion layer including a light absorbing agent and a thermally degradable resin is formed in advance, is attached across the adhesive layer to the semiconductor wafer, has been proposed as another method (for example, refer to JP-A-2004-64040).

Also, a method whereby a process using a chemical is carried out on a main surface of the semiconductor substrate in a condition wherein the side surface of the semiconductor substrate is still covered with tape has been proposed as another method (for example, refer to JP-A-2011-219503, JP-A-2011-222541, and JP-A-2006-352078). Also, a method whereby tape is attached to one main surface of the semiconductor substrate, after which a plating process is carried on the other main surface of the semiconductor substrate, has been proposed as another method (for example, refer to JP-A-2011-222898).

SUMMARY

However, when the thickness of the semiconductor substrate is small, at a thickness in the region of, for example, 30 μm to 200 μm, warpage occurs in the semiconductor substrate in the steps before the plating process. Because of this, when fixing the semiconductor substrate by fitting it into a dedicated jig with a structure such that the plating solution does not reach the back surface side of the semiconductor substrate, there is concern that the semiconductor substrate will crack or chip when installing the semiconductor substrate in the dedicated jig. Consequently, as the work of fixing the semiconductor substrate by fitting it into a dedicated jig is difficult to automate and is thus manual work carried out by an operator, time and effort are required, and there is a problem in that mass production cannot be carried out.

Also, the method whereby the semiconductor substrate back surface side on which no plating layer is to be formed is protected by a resist film is such that, as there is low adhesion between the metal layer (back surface electrode) already formed on the back surface side of the semiconductor substrate and the resist, the resist becomes detached from the back surface electrode due to an electroless plating process forming a plating layer at a temperature of around 80° C. Furthermore, there is concern that elements such as an organic solvent in the resist will dissolve in the plating solution during the electroless plating process, thereby contaminating the plating solution.

When the plating solution is contaminated by an organic solvent or the like, there occur problems such as poor adhesion between the plating layer and metal layer, a condition wherein the plating layer surface partially protrudes (plating layer swelling), no plating layer deposition, a drop in deposition speed, uneven or cloudy plating surface gloss, and unintended plating layer deposition. Because of this, it is necessary to replace the contaminated plating solution and clean the plating tank. Also, as the resist is expensive, there is a problem in that the manufacturing cost of the power semiconductor element increases.

Also, when the semiconductor substrate is thin at 200 μm or less, the semiconductor substrate warps due to stress generated when hardening the resist applied to the semiconductor substrate back surface, and there is a problem in that automatic conveying of the semiconductor substrate is difficult. These problems are not limited to the case of forming a nickel layer using an electroless plating process (the electroless nickel plating process), but also occur in the same way when forming another metal layer, such as a gold plating layer, using an electroless plating process.

Also, JP-A-2005-191550 and JP-A-2007-317964 are such that it is necessary to dissolve the adhesive layer between the support plate and semiconductor substrate with alcohol when detaching the support plate from the semiconductor substrate, because of which small holes are formed all over the support plate from the non-adhering surface through to the adhering surface. Because of this, when applying JP-A-2005-191550 and carrying out an electroless plating process, a chemical such as nitric acid (a strong acid) or a sodium hydroxide solution (a strong alkali) used in the electroless plating process reaches the adhesive layer through the holes in the support plate. Because of this, the adhesive layer dissolves and adhesiveness is lost, because of which the support plate becomes detached from the semiconductor substrate. Also, the plating solution is contaminated by the dissolved adhesive layer.

Also, JP-A-2004-64040 is such that glass is used for the light permeable supporting body attached to the semiconductor substrate, and a photothermal conversion layer including a light absorbing agent and a thermally degradable resin is formed in advance on the adhering surface of the light permeable supporting body in order to detach the light permeable supporting body from the adhesive layer on the semiconductor substrate surface. This method has a problem of leading to a rise in manufacturing cost for reasons such as the cost of the light permeable supporting body being high, the cost of forming the photothermal conversion layer on the glass, which is the light permeable supporting body, being high, and the cost of recycling the light permeable supporting body (cleaning the dismantled photothermal conversion layer) being high. Also, JP-A-2004-64040 is such that, after detaching the light permeable supporting body from the semiconductor substrate, it is necessary to detach the adhesive layer remaining on the semiconductor substrate with peeling tape or the like.

Embodiments of the invention, in order to eliminate the heretofore described problems with the heretofore known technology, have an object of providing a semiconductor device manufacturing method such that, when carrying out a plating process on one main surface side of a semiconductor substrate, an unintended deposition of a plating layer on the other main surface side of the semiconductor substrate is prevented. Also, embodiments of the invention, in order to eliminate the heretofore described problems with the heretofore known technology, have an object of providing a semiconductor device manufacturing method such that it is possible to stably form a plating layer at low cost on one main surface side of a semiconductor substrate.

In order to solve the heretofore described problems, and achieve the objects of embodiments of the invention, a semiconductor device manufacturing method according to an aspect of the invention is a semiconductor device manufacturing method whereby a plating layer is formed using a plating process on one main surface side of a semiconductor substrate, and the method has the following characteristics. Firstly, an electrode formation step or process of forming a first electrode on one main surface side of the semiconductor substrate and forming a second electrode on the other main surface side of the semiconductor substrate is carried out. Next, a first film attachment step or process of attaching a first film to the other main surface of the semiconductor substrate after the electrode formation step or process in order to prevent a deposition of the plating layer on the second electrode when carrying out the plating process is carried out. Next, a second film attachment step or process of attaching a second film to an outer peripheral portion of the semiconductor substrate after the first film attachment step or process in order to prevent a deposition of the plating layer on the outer peripheral portion of the semiconductor substrate when carrying out the plating process is carried out. Next, a plating step or process of forming the plating layer in contact with the first electrode on the one main surface side of the semiconductor substrate using the plating process after the second film attachment step or process is carried out.

Also, the semiconductor device manufacturing method according to the aspect of the invention is such that the second film is attached to the outer peripheral portion of the semiconductor substrate in the second film attachment step or process so as to cover from a part of the one main surface of the semiconductor substrate to a part of the other main surface thereof.

Also, the semiconductor device manufacturing method according to the aspect of the invention is such that the second film is attached to the outer peripheral portion of the semiconductor substrate in the second film attachment step or process so that an end portion of the second film overlaps an end portion of the first film.

Also, the semiconductor device manufacturing method according to the aspect of the invention is such that air remaining between the other main surface of the semiconductor substrate and the first film is pushed out to the exterior after the first film attachment step or process or while attaching the first film.

Also, the semiconductor device manufacturing method according to the aspect of the invention is such that air remaining between the outer peripheral portion of the semiconductor substrate and the second film is pushed out to the exterior after the second film attachment step or process or while attaching the second film.

Also, the semiconductor device manufacturing method according to the aspect of the invention is such that a resin member or a solid member is provided in a notch portion or orientation flat portion indicating the crystal axis orientation of the semiconductor substrate, after the first film attachment step or process and before the second film attachment step or process, so that the planar form of the semiconductor substrate is circular.

Also, the semiconductor device manufacturing method according to the aspect of the invention is such that the first film has heat resistance with respect to the temperature of the plating process.

Also, the semiconductor device manufacturing method according to the aspect of the invention is such that the first film has heat resistance with respect to a temperature of 100° C. or more.

Also, the semiconductor device manufacturing method according to the aspect of the invention is such that the second film has heat resistance with respect to the temperature of the plating process.

Also, the semiconductor device manufacturing method according to the aspect of the invention is such that the second film has heat resistance with respect to a temperature of 100° C. or more.

Also, the semiconductor device manufacturing method according to the aspect of the invention is such that a plurality of plating layers are stacked sequentially on the first electrode in the plating step or process.

Also, the semiconductor device manufacturing method according to the aspect of the invention is such that the plating step or process includes at least a step or process of forming a nickel layer on the first electrode using an electroless plating process or a step or process of forming a nickel layer on the first electrode using an electrolytic plating process.

According to embodiments of the invention, it is possible to prevent plating solution from coming into contact with the back surface and side surface, on which no plating layer is to be formed, of the semiconductor substrate by carrying out a plating process on one main surface (the front surface) of the semiconductor substrate in a condition wherein the other main surface (the back surface) and the outer peripheral portion of the semiconductor substrate are covered with the first and second films respectively.

Also, according to embodiments of the invention, it is possible to prevent the side surface of the semiconductor substrate from coming into contact with plating solution in a plating tank, or with plating solution penetrating from a lateral direction end portion of the second film to an adhesive layer, by attaching the second film to the outer peripheral portion of the semiconductor substrate so as to cover from a part of the front surface of the semiconductor substrate to a part of the back surface thereof. Also, it is possible to prevent plating solution from penetrating from between the first film and second film by attaching the second film so as to overlap with an end portion of the first film.

Also, according to embodiments of the invention, it is possible to reduce the amount of air remaining between the semiconductor substrate and second film by providing a resin member, or the like, in the notch portion or orientation flat portion of the semiconductor substrate so that the planar form of the semiconductor substrate is circular. Also, it is possible to further reduce the amount of air remaining between the semiconductor substrate and second film by attaching the second film so as to push out the air remaining between the semiconductor substrate and second film. Because of this, it is possible to prevent the second film from becoming detached due to the air remaining between the semiconductor substrate and second film expanding in a plating process subsequently carried out at a temperature of in the region of 80° C.

Also, according to embodiments of the invention, it is possible to carry out a plating process on an inexpensive FZ substrate, without using an expensive resist. Also, it is possible to carry out a plating process on an inexpensive FZ substrate without using an expensive light permeable supporting body, as is done in JP-A-2004-64040, and there is thus no need to recycle the light permeable supporting body. Consequently, it is possible to reduce the manufacturing cost of a power semiconductor element.

According to the semiconductor device manufacturing method according to embodiments of the invention, an advantage is achieved in that it is possible, when carrying out a plating process on one main surface side of a semiconductor substrate, to prevent an unintended deposition of a plating layer on the other main surface side of the semiconductor substrate. Also, according to the semiconductor device manufacturing method according to embodiments of the invention, an advantage is achieved in that it is possible to stably form a plating layer at low cost on one main surface side of a semiconductor substrate.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 4 is a sectional view showing a condition partway through manufacture in the flowchart shown in FIG. 2;

FIG. 5 is a sectional view showing a condition partway through manufacture in the flowchart shown in FIG. 2;

DESCRIPTION OF EMBODIMENTS

Hereafter, with reference to the attached drawings, a detailed description will be given of a preferred embodiment of a semiconductor device manufacturing method according to the invention. In the description and attached drawings, a layer or region being prefixed by n or p indicates that electrons or holes respectively are majority carriers. Also, + or − being added to n or p indicates a higher impurity concentration or lower impurity concentration respectively than that in a layer or region to which neither is added. The same reference signs are given to the same configurations in the following embodiment description and attached drawings, and redundant descriptions are omitted.

Embodiment

Figure 1:
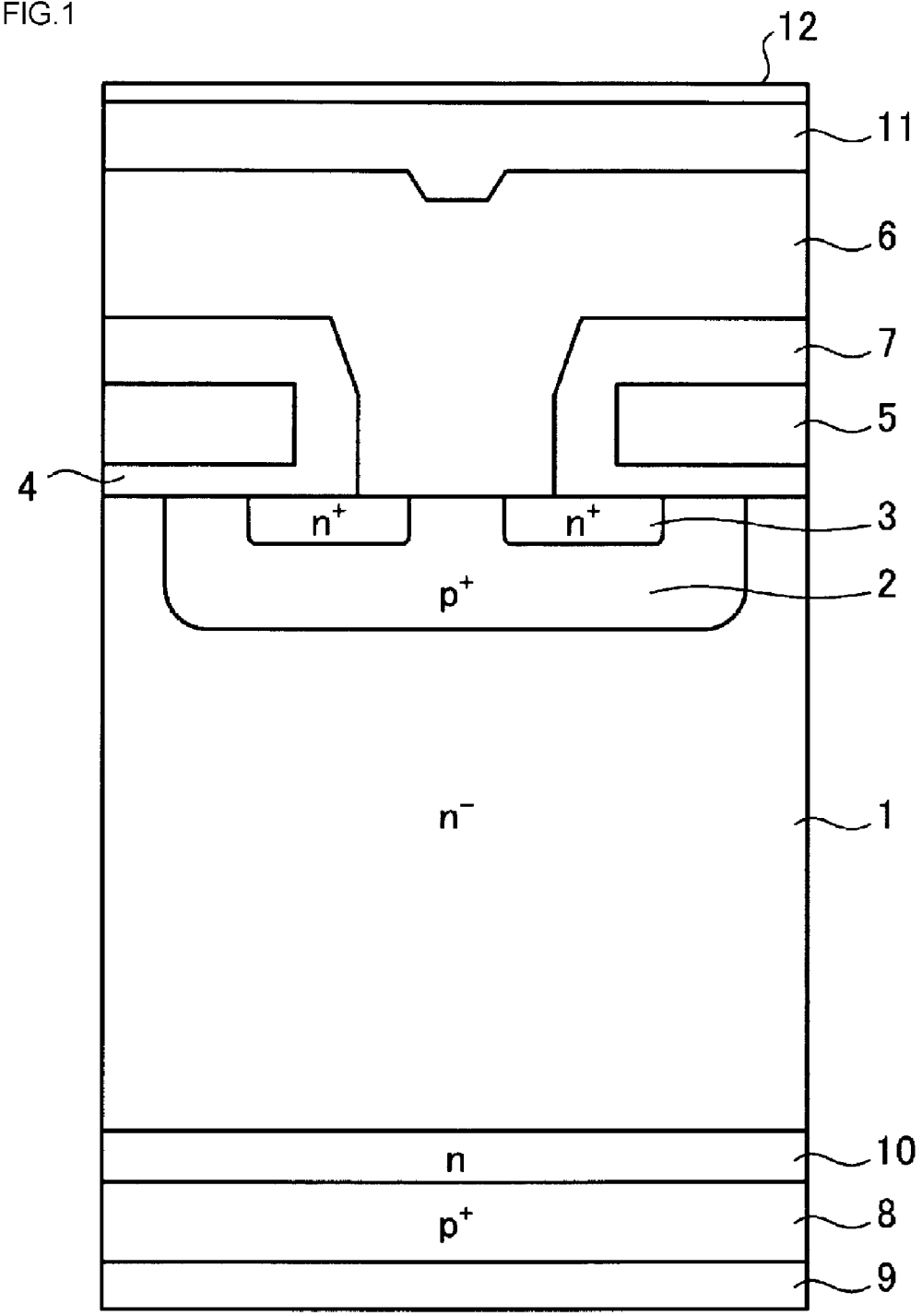
FIG. 1 is a sectional view showing the configuration of a semiconductor device manufactured using a semiconductor device manufacturing method according to an embodiment.

Firstly, a description will be given of a semiconductor device fabricated (manufactured) using the semiconductor device manufacturing method according to the embodiment, with a field stop (FS) type IGBT of, for example, a planar gate structure as an example. FIG. 1 is a sectional view showing the configuration of the semiconductor device manufactured using the semiconductor device manufacturing method according to the embodiment. As shown in FIG. 1, an n⁻ type semiconductor substrate formed of, for example, an FZ substrate forms an n⁻ type drift layer 1, and a p⁺ type base region 2 is selectively provided in a surface layer of one main surface (the front surface) of the n⁻ type drift layer 1. An n⁺ type emitter region 3 is selectively provided inside the p⁻ type base region 2. The n⁻ type drift layer 1 has a function as an active layer.

A gate electrode 5 is provided across a gate oxide film 4 on the surface of a portion of the p⁺ type base region 2 sandwiched by the n⁻ type drift layer 1 and n⁺ type emitter region 3. An emitter electrode 6 is in contact with the n⁺ type emitter region 3 and p⁺ type base region 2, and is isolated from the gate electrode 5 by an interlayer dielectric film 7. It is preferable that the emitter electrode (first electrode) 6 is, for example, a metal film with aluminum (Al) as a main element. The reason for this is that it is possible to improve the adhesion between the emitter electrode 6 and n⁻ type semiconductor substrate (FZ substrate).

Also, it is preferable that the emitter electrode 6 is, for example, an aluminum-silicon (AlSi) layer including silicon (Si) at a content of 0.5% by weight or more, 2% by weight or less, and preferably 1% by weight or less. The reason for this is as follows. When the emitter electrode 6 is an aluminum layer, a metal spike (aluminum spike) protruding from the emitter electrode 6 into the n⁻ type semiconductor substrate (silicon) is created when forming the emitter electrode 6 and when carrying out subsequent heat treatment. When the aluminum spike reaches the p⁺ type base region 2 or n⁺ type emitter region 3, the electrical characteristics deteriorate. By adopting an aluminum-silicon layer as the emitter electrode 6, it is possible to prevent the aluminum spike.

A nickel plating layer 11 and gold plating layer 12 are deposited sequentially on the surface of the emitter electrode 6. The nickel plating layer 11 and gold plating layer 12 have the emitter potential, and function as the emitter electrode 6. The nickel plating layer 11 improves the adhesion with the solder when solder joining an external terminal, omitted from the drawing. The gold plating layer 12 prevents oxidation of the nickel plating layer 11. The thickness of the nickel plating layer 11 may be, for example, in the region of 5 μm. The thickness of the gold plating layer 12 may be, for example, in the region of 0.03 μm.

A p⁺ type collector layer 8 and a collector electrode (second electrode) 9 are provided on the other main surface (back surface) of the n⁻ type semiconductor substrate. The collector electrode 9 is formed by, for example, an aluminum layer, a titanium (Ti) layer, a nickel (Ni) layer, and a gold (Au) layer being deposited sequentially. The metal layer structure of the collector electrode 9 is omitted from FIG. 1 (the same applies to FIGS. 4 to 9). Of the metal layers configuring the collector electrode 9, it is preferable that the aluminum layer is, for example, an aluminum-silicon layer including silicon at a content of 0.5% by weight or more, 2% by weight or less, and preferably 1% by weight or less. The reason for this is as follows.

When the collector electrode 9 includes an aluminum layer, an aluminum spike protruding from the collector electrode 9 into the n⁻ type semiconductor substrate is created, as with the emitter electrode 6. When the aluminum spike reaches the p-n junction between an n-type buffer layer 10 and the p⁺ type collector layer 8, there is a deterioration in the electrical characteristics, such as poor reverse leakage current. By adopting an aluminum-silicon layer as the aluminum layer configuring the collector electrode 9, it is possible to prevent the aluminum spike. It is not essential that an aluminum layer configuring the collector electrode 9 is provided.

Also, of the metal layers configuring the collector electrode 9, the titanium layer, the nickel layer, and the gold layer have the following functions. When carrying out chip mounting wherein the collector electrode 9 and an external terminal are joined by soldering, there is concern that the nickel layer and gold layer will fuse into the solder (solder absorption), whereby the underlying aluminum layer will be exposed. As the adhesion between the solder and the aluminum layer (aluminum-silicon layer) is poor, it is possible to prevent the aluminum layer from being exposed by providing the titanium layer between the aluminum layer and nickel layer. Also, the titanium layer prevents nickel in the nickel layer from diffusing into the aluminum layer.

The nickel layer improves the adhesion with the solder when solder joining an external terminal, omitted from the drawing. Also, as the nickel layer film stress is high, it is good that the nickel layer is provided comparatively thinly, in the region of 0.7 μm for example, so that stress generated in the n⁻ type semiconductor substrate is suppressed by forming the nickel layer. The gold layer prevents oxidation of the nickel layer. The n-type buffer 10 is provided between the n⁻ type drift layer 1 and p⁺ type collector layer 8.

Figure 2:
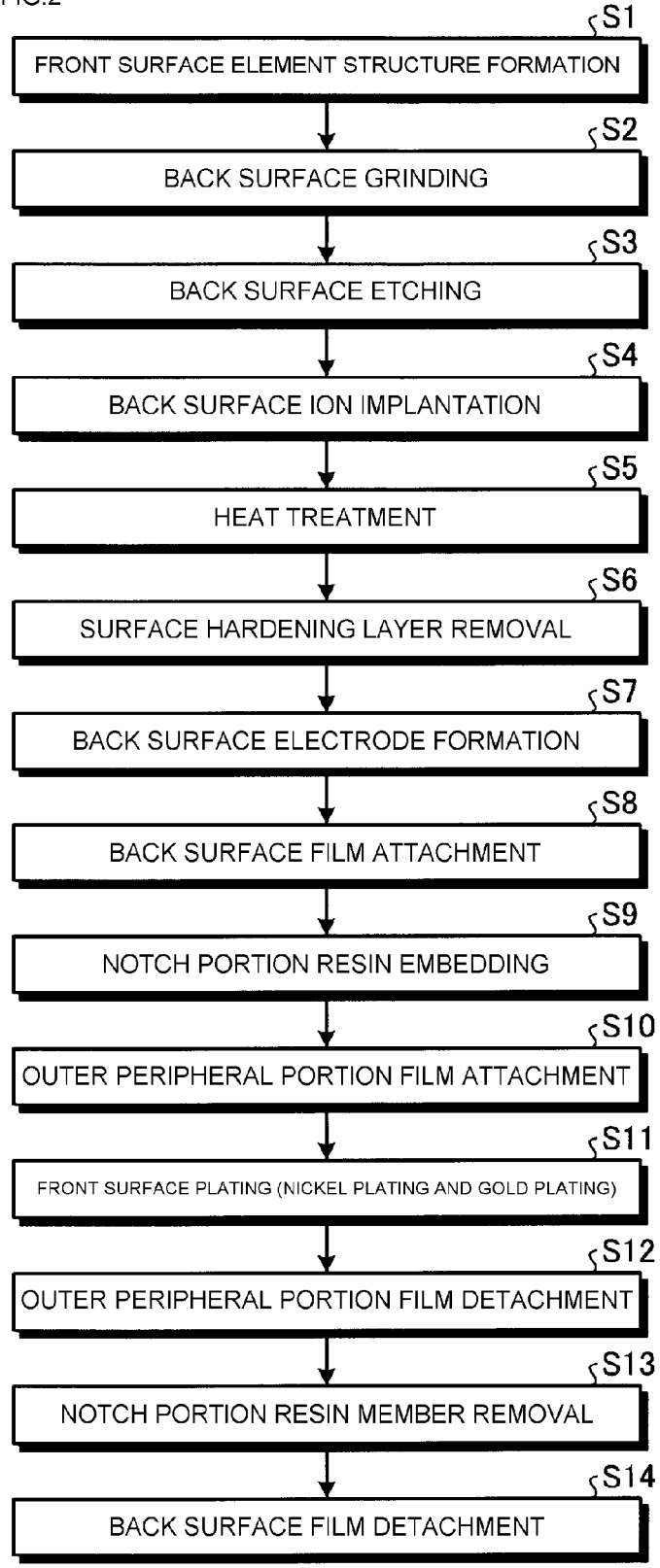
FIG. 2 is a flowchart showing an outline of the semiconductor device manufacturing method according to the embodiment.
Figure 6:
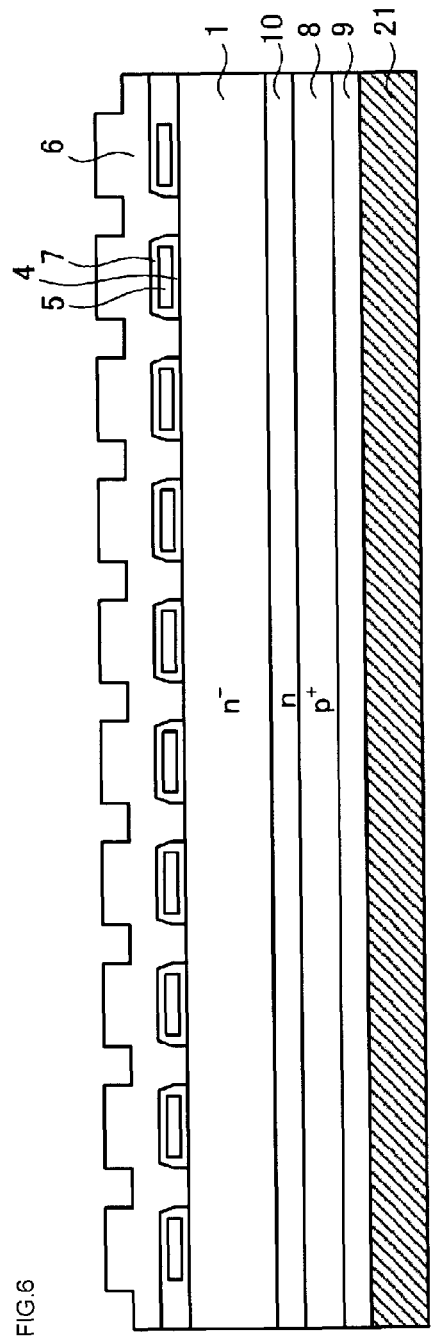
FIG. 6 is a sectional view showing a condition partway through manufacture in the flowchart shown in FIG. 2.
Figure 7:
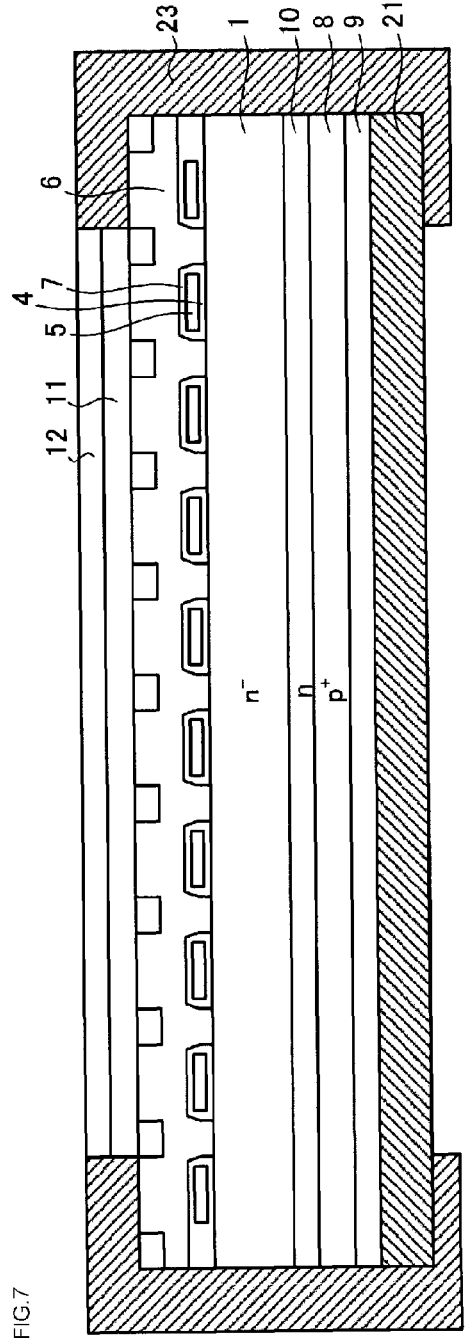
FIG. 7 is a sectional view showing a condition partway through manufacture in the flowchart shown in FIG. 2.
Figure 8:
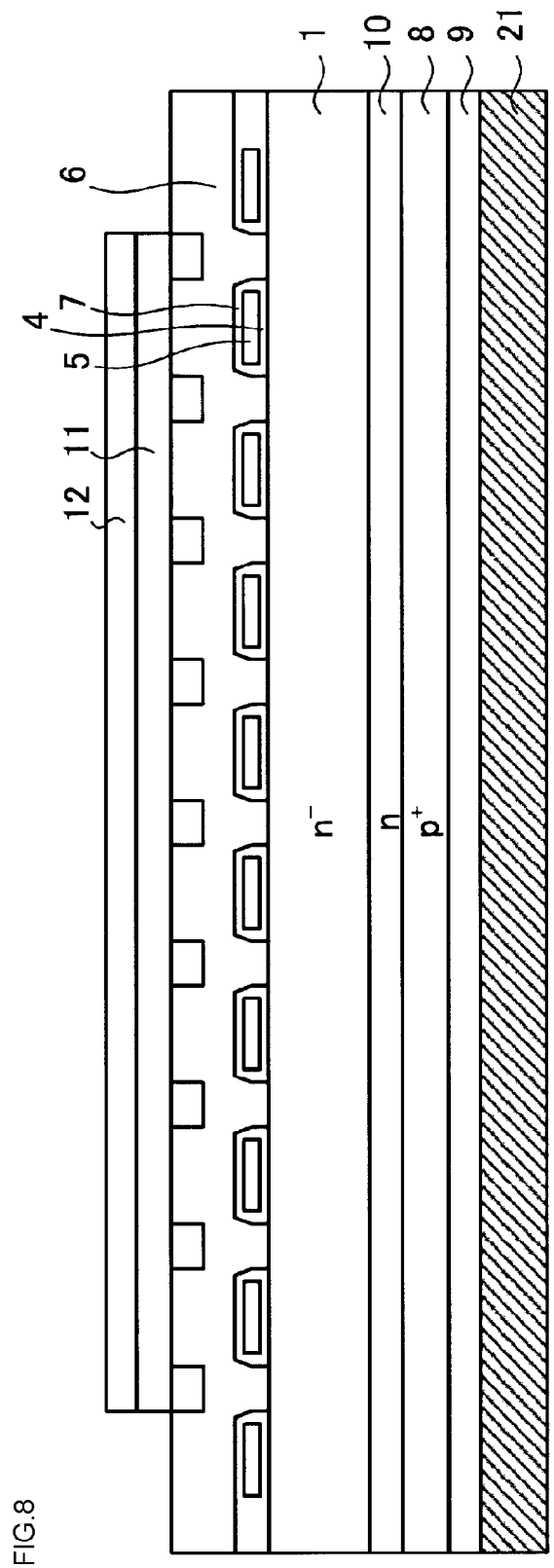
FIG. 8 is a sectional view showing a condition partway through manufacture in the flowchart shown in FIG. 2.
Figure 9:
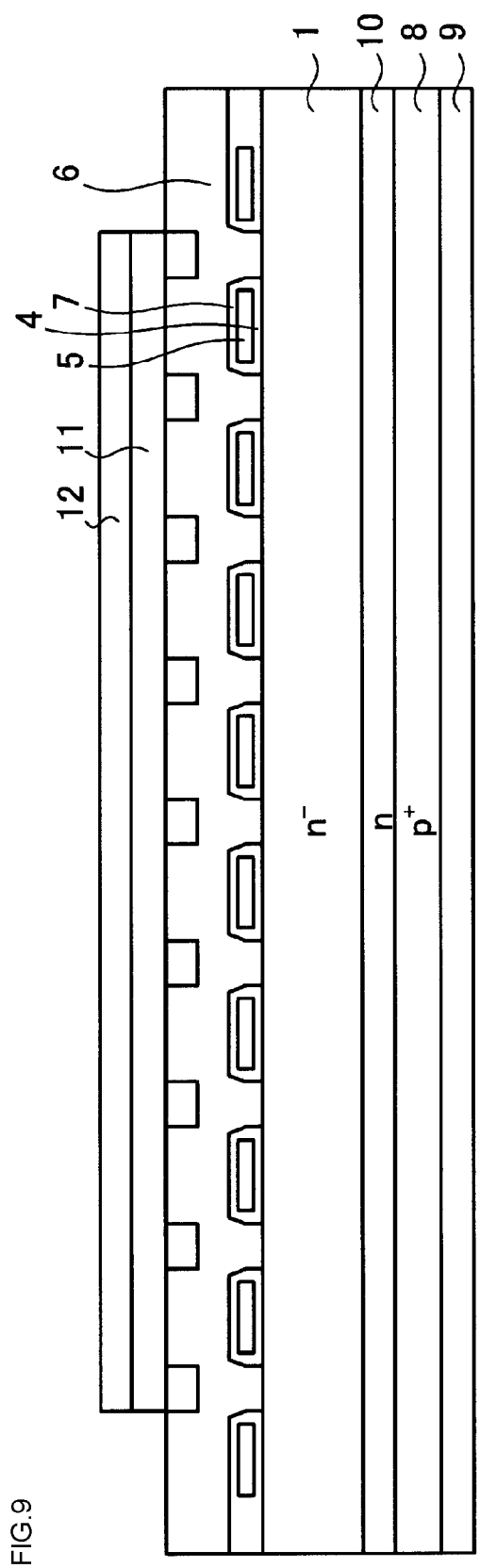
FIG. 9 is a sectional view showing a condition partway through manufacture in the flowchart shown in FIG. 2.
Figure 10:
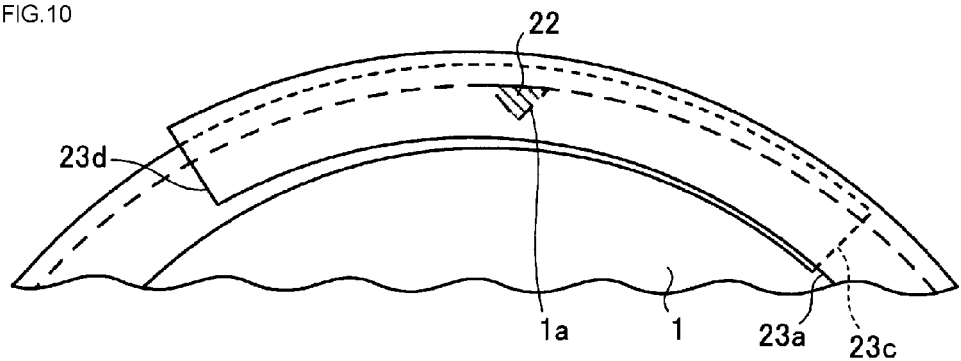
FIG. 10 is a plan view showing a condition partway through manufacture in the flowchart shown in FIG. 2.
Figure 11:
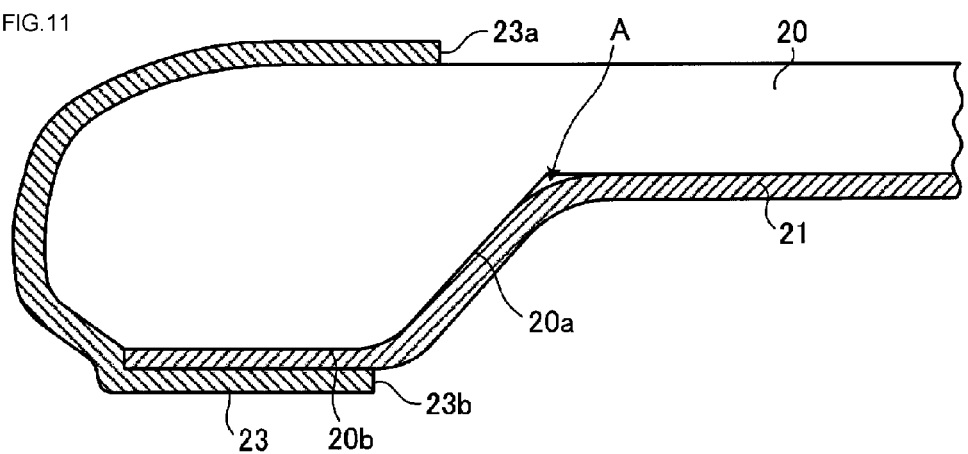
FIG. 11 is a sectional view showing a condition partway through manufacture in the flowchart shown in FIG. 2.
Figure 12:
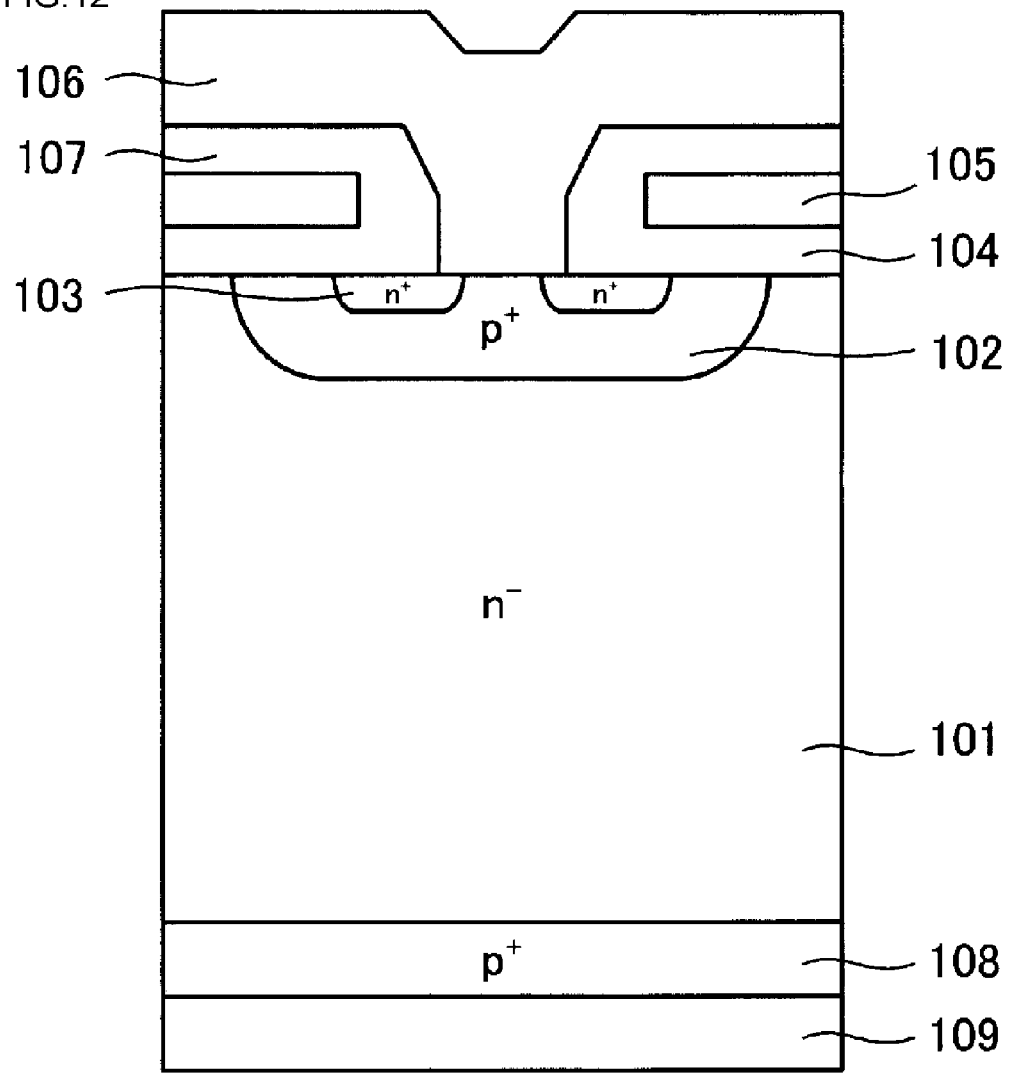
FIG. 12 is a sectional view showing the configuration of a heretofore known NPT type IGBT.
Figure 13:
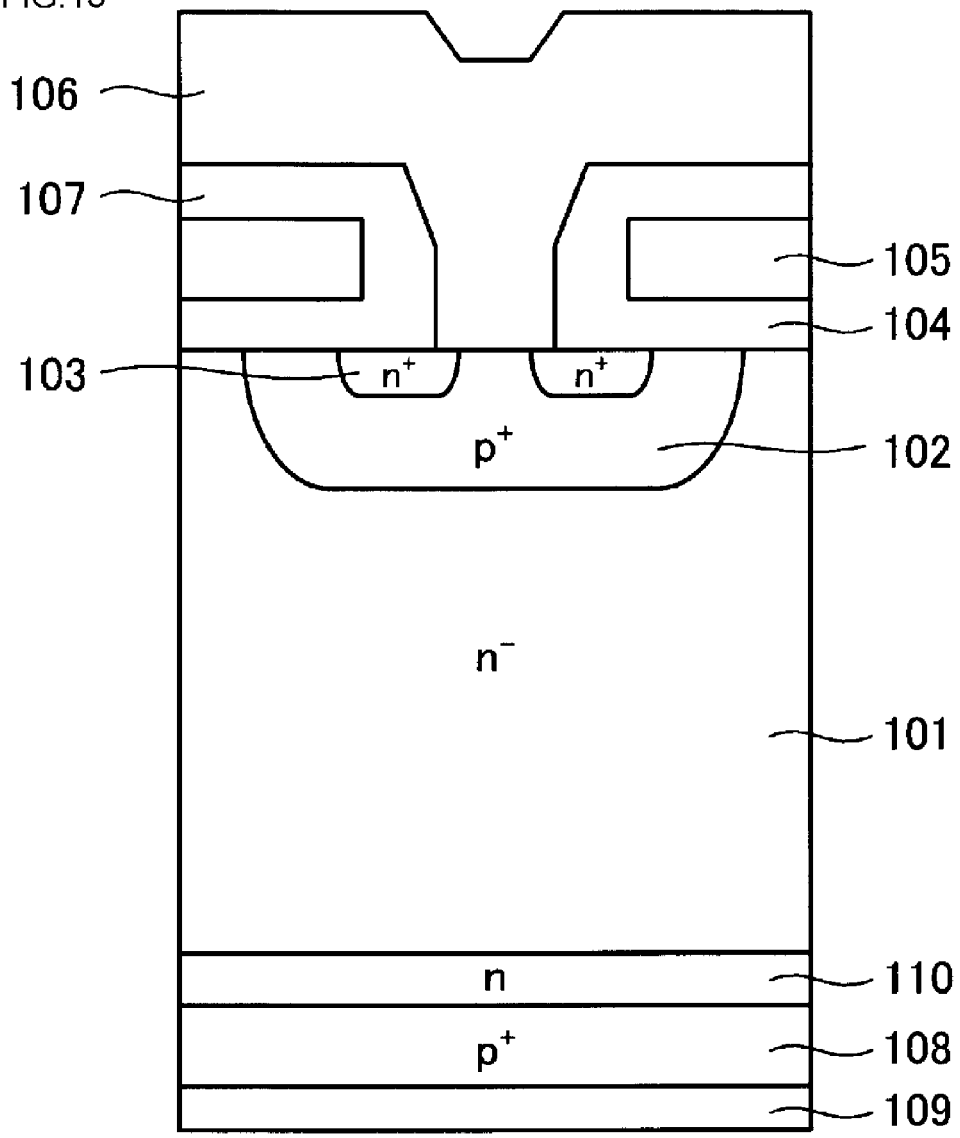
FIG. 13 is a sectional view showing the configuration of a heretofore known FS type IGBT.

Next, a description will be given of the semiconductor device manufacturing method according to the embodiment, with a case of fabricating the FS type IGBT shown in FIG. 1 as an example. FIG. 2 is a flowchart showing an outline of the semiconductor device manufacturing method according to the embodiment. FIGS. 3 to 9 and 11 are sectional views showing conditions partway through manufacture in the flowchart shown in FIG. 2. FIG. 10 is a plan view showing a condition partway through manufacture in the flowchart shown in FIG. 2. FIG. 10 shows a condition wherein the n⁻ type semiconductor substrate shown in FIG. 7 is seen from the front surface side. FIG. 11 shows a case wherein a different form is adopted for the n⁻ type semiconductor substrate shown in FIG. 7.

Figure 3:
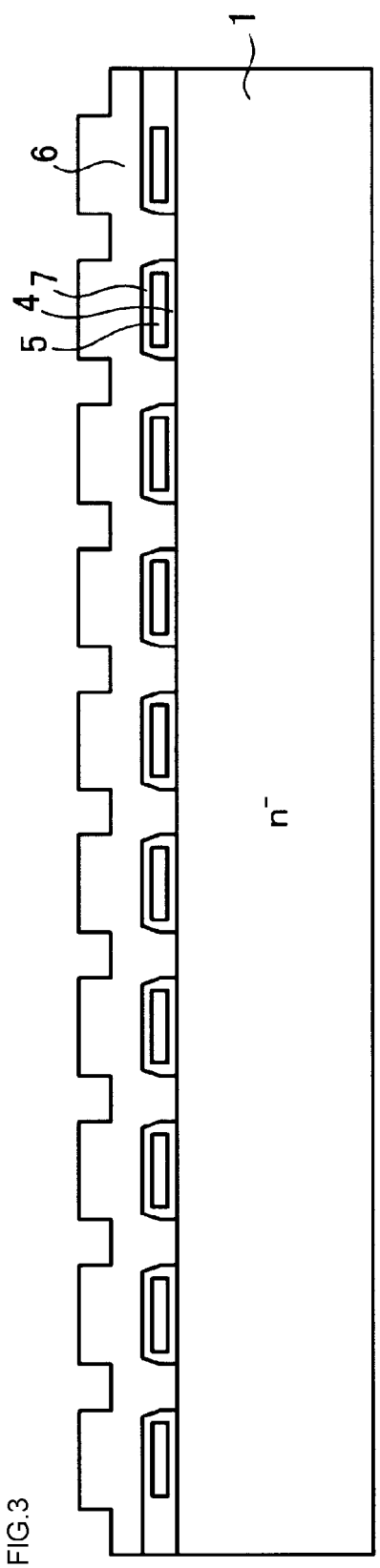
FIG. 3 is a sectional view showing a condition partway through manufacture in the flowchart shown in FIG. 2.

Firstly, a front surface element structure formed of the p⁺ type base region 2, n⁺ type emitter region 3, gate oxide film 4, gate electrode 5, emitter electrode 6, interlayer dielectric film 7, and the like, is formed on the front surface of an n⁻ type semiconductor substrate (wafer) formed of an FZ substrate with a thickness of, for example, 600 μm (step S1). The emitter electrode 6 is formed using, for example, a vapor deposition method or a sputtering method. The condition thus far is shown in FIG. 3. In FIG. 3, the n⁻ type semiconductor substrate forming the n⁻ type drift layer 1 is indicated by reference sign 1. Also, the p⁺ type base region 2 and n⁺ type emitter region 3 are omitted from the drawing (hereafter, the same applies to FIGS. 4 to 9).

Next, the back surface of the n⁻ type semiconductor substrate 1 is ground (back grinding), thereby reducing the thickness of the n⁻ type semiconductor substrate 1 to in the region of, for example, 100 μm (step S2). Next, in order to remove damage occurring on the back surface of the n⁻ type semiconductor substrate 1 due to the grinding, and to alleviate stress exerted on the n⁻ type semiconductor substrate 1, the whole of the back surface of the n⁻ type semiconductor substrate 1 is evenly removed by etching, thereby further reducing the thickness of the n⁻ type semiconductor substrate 1 to in the region of 20 μm (step S3).

The etching in step S3 may be a wet etching or may be a dry etching. Also, by carrying out the etching using a spin etcher, it is possible to prevent damage due to the etching from occurring on the front surface side of the n⁻ type semiconductor substrate 1. Nitric acid ($HNO_3$) or a mixed acid having nitric acid as a main element, for example, is used as an etchant.

Next, after cleaning the n⁻ type semiconductor substrate 1, two kinds of ion are implanted sequentially into the ground back surface of the n⁻ type semiconductor substrate 1 (step S4), after which, heat treatment for activating the ions implanted in the n⁻ type semiconductor substrate 1 is carried out (step S5), thereby forming the n-type buffer layer 10 and p⁺ type collector layer 8 on the back surface side of the n⁻ type semiconductor substrate 1. The condition thus far is shown in FIG. 4. Next, a surface hardening layer, such as a natural oxide film, formed in a surface layer of the p⁺ type collector layer 8 is removed using a dilute hydrofluoric acid (HF) (step S6).

Next, an aluminum layer, a titanium layer, a nickel layer, and a gold layer are deposited sequentially on the surface of the p⁺ type collector layer 8 using a vapor deposition method or sputtering method, whereby the collector electrode 9 formed by the stacking of these metal layers is formed as a back surface electrode (step S7). The condition thus far is shown in FIG. 5. The collector electrode 9 is formed over the whole of the back surface of the n⁻ type semiconductor substrate 1, with no patterning being carried out. Consequently, it is possible to successively form a plurality of metal layers by applying a vapor deposition method or sputtering method, and thus possible to improve productivity.

Next, a first film 21 is attached to the whole of the back surface of the n⁻ type semiconductor substrate 1, that is, the whole of the surface of the collector electrode 9 (step S8). The first film 21 is formed of a film base material and an adhesive layer (not shown), wherein the adhesive layer side of the first film 21 is attached to the back surface of the n⁻ type semiconductor substrate 1. The condition thus far is shown in FIG. 6. In step S8, after attaching the first film 21 to the back surface of the n⁻ type semiconductor substrate 1, or while attaching the first film 21 to the back surface of the n⁻ type semiconductor substrate 1, air remaining between the n⁻ type semiconductor substrate 1 and the first film 21 may be pushed out by, for example, mechanically pushing the first film 21 against the back surface of the n⁻ type semiconductor substrate 1.

Also, a substrate wherein, when reducing the thickness of the back surface of an n⁻ type semiconductor substrate by grinding, the thickness is reduced in only a central portion of the back surface of the n⁻ type semiconductor substrate while an outer peripheral portion is left thick over a predetermined width, may also be used. A substrate (hereafter referred to as a ribbed n⁻ type semiconductor substrate 20) wherein the outer peripheral portion is left thick over a predetermined width in this way is such that, as the outer peripheral portion acts as a reinforcement member, it is possible to maintain the strength of the n⁻ type semiconductor substrate 20 even when the central portion of the back surface of the n⁻ type semiconductor substrate 20 is ground thin.

When using this kind of ribbed n⁻ type semiconductor substrate 20 too, a front surface element structure is formed in step S1 on the front surface side of the thinly ground region of the central portion of the n⁻ type semiconductor substrate 20, in the same way as heretofore described, and after the central portion of the n⁻ type semiconductor substrate 20 is ground thin in step S2, a power semiconductor chip is formed by the steps from step S3 onward being carried out.

With respect to the ribbed n⁻ type semiconductor substrate 20 too, the first film 21 is attached to the central portion and outer peripheral portion of the back surface in step S8. At this time, the first film 21 is attached so as to follow the contours of a step 20a between the central portion and outer peripheral portion of the back surface of the n⁻ type semiconductor substrate 20 and a flat portion 20b of the outer peripheral portion of the n⁻ type semiconductor substrate 20 parallel to the substrate main surface. A sectional view of a case in which the ribbed n⁻ type semiconductor substrate 20 is adopted is shown in FIG. 11.

It is good that the diameter of the first film 21 is the same as the diameter of the n⁻ type semiconductor substrate 1 or in the region of, for example, 1 mm less, preferably 0.5 mm less, than the diameter of the n⁻ type semiconductor substrate 1. The reason for this is that when the first film 21 protrudes outward from the outer peripheral portion of the n⁻ type semiconductor substrate 1 after the first film 21 has been attached to the n⁻ type semiconductor substrate 1, a second film 23 to be attached to the outer peripheral portion of the n⁻ type semiconductor substrate 1 is difficult to attach, and air is liable to remain between the n⁻ type semiconductor substrate 1 and second film 23.

Also, it is good that the attachment of the first film 21 is carried out in a low pressure atmosphere, preferably inside a vacuum chamber (not shown). By attaching the first film 21 in a low pressure atmosphere, it is possible to prevent air from remaining between the first film 21 and n⁻ type semiconductor substrate 1.

Also, when adopting the ribbed n⁻ type semiconductor substrate 20, it may happen, depending on the rigidity of the first film 21, that the first film 21 does not completely follow the contour of the step 20a, and that the first film 21 is not attached to the whole of the back surface of the ribbed n⁻ type semiconductor substrate 20. In FIG. 11, a space created between the step 20a of the n⁻ type semiconductor substrate 20 and the first film 21 is indicated by an arrow A. Even when this kind of space remains, the first film 21 being attached in a low pressure atmosphere means that the amount of air remaining in the space between the n⁻ type semiconductor substrate 20 and first film 21 is extremely small. Because of this, this portion does not expand greatly even when immersed in a chemical in a plating step, to be described hereafter. Alternatively, when using the ribbed n⁻ type semiconductor substrate 20, it is possible to dramatically reduce the space indicated by the arrow A by setting the degree of vacuum inside the chamber on the high side.

For example, an adhesive whose adhesiveness decreases when irradiated with ultraviolet (UV) may be used as the adhesive layer (not shown) of the first film 21. That is, the first film 21 may be a UV film with ultraviolet permeability of a thickness of, for example, 10 μm to 50 μm. A film made of, for example, polyethylene terephthalate (PET), a polyimide, polyolefin, polycarbonate, vinyl chloride, polypropylene, an acrylonitrile butadiene styrene copolymer (ABS resin), nylon, or polyurethane may be used as the film base material of the first film 21.

A film having chemical resistance with respect to the plating solution of the plating process to be described hereafter, and heat resistance with respect to the temperature of the plating solution, is used as the first film 21. Specifically, as the temperature of the plating solution in the plating process to be described hereafter is in the region of, for example, 80° C., it is preferable that the first film 21 has heat resistance of in the region of, for example, 100° C. In the same way as for the first film 21, films having chemical resistance with respect to the plating solution of the plating process, and heat resistance with respect to the temperature of the plating solution, are also used as the second film 23 and a resin member 22, to be described hereafter.

Next, by a V-shaped cutaway (notch portion) 1a indicating the crystal axis orientation provided in a side surface of the n⁻ semiconductor substrate 1 being filled with the resin member 22, a gap created in the outer peripheral side surface of the n⁻ semiconductor substrate 1 due to the notch portion 1a being provided is filled (step S9). Specifically, the notch portion 1a is filled with the resin member 22 so that the planar form of the n⁻ semiconductor substrate 1 is circular. When an orientation flat portion (not shown) is formed in the n⁻ semiconductor substrate 1 too, a resin member or solid member is provided in the orientation flat portion so that the planar form of the n⁻ semiconductor substrate 1 is circular.

Next, the second film 23 is attached to an outer peripheral portion of the n⁻ semiconductor substrate 1 (step S10). The second film 23 is formed of a film base material and an adhesive layer (not shown), wherein the adhesive layer side of the second film 23 is attached to the outer peripheral portion of the n⁻ semiconductor substrate 1. Specifically, the second film 23 has a practically rectangular shape, and the second film 23 is attached so as to cover the n⁻ semiconductor substrate 1 side surface from the front surface to the back surface of the outer peripheral portion of the n⁻ semiconductor substrate 1 in the lateral direction of the second film 23, and to go at least once around the outer periphery of the n⁻ semiconductor substrate 1 in the longitudinal direction of the second film 23.

Specifically, one end portion 23a in the lateral direction of the second film 23 is positioned on the front surface of the n⁻ semiconductor substrate 1, while another end portion 23b in the lateral direction of the second film 23 is positioned on the back surface of the n⁻ semiconductor substrate 1. That is, the second film 23 is attached so as to cover the side surface of the n⁻ semiconductor substrate 1 straddling the n⁻ semiconductor substrate 1 from the front surface to the back surface thereof. Also, it is preferable that the other end portion 23b in the lateral direction of the second film 23 overlaps an end portion of the first film 21 attached to the back surface of the n⁻ semiconductor substrate 1.

It is preferable that two end portions 23c and 23d in the longitudinal direction of the second film 23 overlap by in the region of, for example, 1 cm to 5 cm. A plan view of the condition thus far is shown in FIG. 10. A sectional view of a condition wherein the second film 23 is attached to the n⁻ semiconductor substrate 1 is shown in FIG. 7. In FIG. 10, the broken line coarser than the broken line indicating the bottom second film 23 layer in a portion in which two layers of the second film 23 overlap indicates the outline of the n⁻ semiconductor substrate 1. Also, two layers of the second film 23 may overlap in the portion covering the notch portion 1a, as shown in FIG. 10. By two layers overlapping in the portion covering the notch portion 1a, it is possible to suppress permeation of the plating solution, to be described hereafter, even when air remains in the notch portion 1a.

When adopting the ribbed n⁻ type semiconductor substrate 20 too, the second film 23 is attached as with the n⁻ type semiconductor substrate 1, wherein the whole of the back surface is flat. At this time, it is preferable that the other end portion 23b in the lateral direction of the second film 23 completely covers the flat portion 20b of the outer peripheral portion of the n⁻ type semiconductor substrate 20. The condition thus far when adopting the ribbed n⁻ type semiconductor substrate 20 is shown in FIG. 11. A description will be given hereafter of one example of a method of attaching the second film 23.

As the temperature of the plating solution in the plating process to be described hereafter is in the region of, for example, 80° C., air remaining between the first and second films 21 and 23 and the n⁻ type semiconductor substrate 1 expands when the n⁻ type semiconductor substrate 1 is immersed in the plating solution. As the first film 21 is attached to the back surface of the n⁻ type semiconductor substrate 1 in a low pressure atmosphere, as heretofore described, little air remains between the first film 21 and n⁻ type semiconductor substrate 1, and there is little possibility of the first film 21 becoming detached due to the air expanding. By the first film 21 being attached in a low pressure atmosphere when adopting the ribbed n⁻ type semiconductor substrate 20 too, there is little possibility of the first film 21 becoming detached due to expansion of the air remaining between the first film 21 and the step 20a of the n⁻ type semiconductor substrate 20.

Meanwhile, as the second film 23 is attached to the side surface of the n⁻ type semiconductor substrate 1 in the atmosphere, air remains in the notch portion 1a formed in the n⁻ type semiconductor substrate 1 side surface. Consequently, when the air remaining in the notch portion 1a expands when the n⁻ type semiconductor substrate 1 is immersed in the plating solution in the plating process to be described hereafter, there is a possibility of the second film 23 becoming detached from a place facing the notch portion 1a. The reason for this is the short length of the second film 23 from the notch portion 1a to the two end portions 23a and 23b in the longitudinal direction of the second film 23. By attaching the second film 23 of the n⁻ type semiconductor substrate 1 after the gap formed by the notch portion 1a is filled with the resin member 22, as heretofore described, it is possible to reduce the air remaining in the notch portion 1a.

Also, after attaching the second film 23 to the outer peripheral portion of the n⁻ type semiconductor substrate 1, or while attaching the second film 23 to the outer peripheral portion of the n⁻ type semiconductor substrate 1, air remaining between the n⁻ type semiconductor substrate 1 and the second film 23 may be pushed out by, for example, mechanically pushing the second film 23 against the outer peripheral portion of the n⁻ type semiconductor substrate 1. In particular, air is liable to remain in the notch portion 1a between the second film 23 and n⁻ type semiconductor substrate 1. Because of this, it is preferable that air remaining between the n⁻ type semiconductor substrate 1 and the second film 23 is pushed out by, for example, mechanically pushing the second film 23 against the outer peripheral portion of the n⁻ type semiconductor substrate 1 in at least the portion in which air is liable to remain.

Alternatively, air remaining in the notch portion 1a may be pushed out by making a small hole (not shown) in a portion of the second film 23 covering the notch portion 1a, and pressing down with tweezers or the like. Specifically, for example, a small hole is made in a portion of the second film 23 attached to the front surface side or back surface side of the n⁻ type semiconductor substrate 1 and covering the vicinity of the apex of the V-shaped notch portion 1a. Then, the air remaining in the notch portion 1a may be pushed out by sandwiching the n⁻ type semiconductor substrate 1 with tweezers, or the like, sandwiching the n⁻ type semiconductor substrate 1 by coming into contact with the front surface and back surface of the n⁻ type semiconductor substrate 1 across the second film 23. At this time, the adhesive layer of the portion of the second film 23 attached to the front surface side of the n⁻ type semiconductor substrate 1 and the adhesive layer of the portion attached to the back surface side of the n⁻ type semiconductor substrate 1 are attached to each other, because of which, the small hole made in order to push out the air remaining in the notch portion 1a is closed off by the adhesive layer of the second film 23. Because of this, it is possible to prevent penetration of the chemical in the plating step to be described hereafter. This is applicable in the same way when using the ribbed n⁻ type semiconductor substrate 20 too.

As a method of attaching the second film 23 to the outer peripheral portion of the n⁻ type semiconductor substrate 1, it is sufficient that, for example, the n⁻ type semiconductor substrate 1 is fixed to a stage (not shown) including a vacuum chuck for adsorbing the n⁻ type semiconductor substrate 1, and that the second film 23 is attached while the stage is rotated. Then, in a condition wherein the two end portions 23c and 23d in the longitudinal direction of the second film 23 have been caused to overlap by the stage being rotated once, the second film 23 is cut. By providing a place in which the two end portions 23c and 23d in the longitudinal direction of the second film 23 overlap (hereafter referred to as a protruding portion, not shown), the second film 23 is easily detached after the plating process to be described hereafter. A method of detaching the second film 23 will be described hereafter.

For example, an acrylic adhesive may be used for the adhesive layer (not shown) of the second film 23, or an adhesive whose adhesiveness decreases when irradiated with ultraviolet may be used, as for the adhesive layer of the first film 21. The thickness of the film base material of the second film 23 may be in the region of, for example, 10 μm to 100 μm. It is preferable that, for example, a base material having a certain amount of elasticity is used as the film base material of the second film 23 so that no gap occurs in the circumferential side surface of the n⁻ type semiconductor substrate 1. Specifically, a film made of, for example, polyethylene terephthalate (PET), a polyimide, polyolefin, polycarbonate, vinyl chloride, polypropylene, an ABS resin, nylon, or polyurethane may be used as the film base material of the second film 23.

As a film made of polyethylene terephthalate (PET), a polyimide, polyolefin, polycarbonate, vinyl chloride, polypropylene, an ABS resin, nylon, or polyurethane has heat resistance and chemical resistance, it is suitable for application to the first and second films 21 and 23. In particular, a polyimide film has superior heat resistance and chemical resistance, and is preferred for the first and second films 21 and 23. A nylon film has slightly inferior heat resistance and chemical resistance compared with films made of the other above-named materials, but is inexpensive. Because of this, a nylon film is applicable when the time of immersion in the plating solution is short enough that the chemical penetrating into the first and second films 21 and 23 does not reach the adhesive layer.

Also, for example, when the thickness of a plating layer formed by the plating process to be described hereafter is small, and the time of immersion in the plating solution is short, an inexpensive polyethylene terephthalate film may be used as the first and second films 21 and 23. When using a polyethylene terephthalate film as the first and second films 21 and 23, it is possible to increase the time taken for the chemical penetrating into the film to reach the adhesive layer by increasing the thickness of the polyethylene terephthalate film, but as will be described hereafter, the rigidity of the film increases, and attachment to the n⁻ type semiconductor substrate 1 side surface becomes difficult, which is not desirable. Consequently, it is preferable that the first and second films 21 and 23 have a rigidity such that the first and second films 21 and 23 can transform in accordance with the form of the n⁻ type semiconductor substrate 1. Because of this, even when, for example, warpage occurs in the n⁻ type semiconductor substrate 1, it is possible to suppress the amount of air remaining between the first and second films 21 and 23 and the n⁻ type semiconductor substrate 1.

Next, using a general method, preprocessing is carried out for an electroless plating process at a temperature of in the region of, for example, 80° C. Next, using, for example, an electroless plating process, the nickel plating layer 11 is deposited over the whole of the front surface of the n⁻ type semiconductor substrate 1, that is, the whole of the surface of the emitter electrode 6, after which the gold plating layer 12 is further deposited over the whole of the surface of the nickel plating layer 11 (step S11). The condition thus far is shown in FIG. 7. Although the nickel plating layer 11 fuses into the solder when carrying out chip mounting wherein the emitter electrode 6 and an external terminal are joined by soldering in a subsequent step, it is sufficient to design the nickel plating layer 11 to be thick in comparison with the nickel layer configuring the collector electrode 9, so that in the region of, for example, 2 μm of the nickel plating layer 11 remains after the emitter electrode 6 and external terminal are joined by soldering.

By the thickness of the nickel plating layer 11 being in the above-mentioned range, the underlying emitter electrode 6 is not exposed even when the nickel plating layer 11 fuses into the solder when carrying out chip mounting. Because of this, the solder does not reach the emitter electrode 6, which is formed of an aluminum layer having low adhesion with solder. In order to form the nickel plating layer 11 to a desired thickness, it is sufficient to, for example, calculate the processing time for obtaining the desired thickness of the nickel plating layer 11 from the deposition rate, or the like, of the nickel plating layer 11, and carry out the electroless plating process based on the processing time.

Next, the second film 23 is detached from the outer peripheral portion of the n⁻ type semiconductor substrate 1 (step S12). The condition thus far is shown in FIG. 8. Specifically, for example, the n⁻ type semiconductor substrate 1 is fixed on a stage including a vacuum chuck, in the same way as when attaching the second film 23 to the outer peripheral portion of the n⁻ type semiconductor substrate 1. Then, in a condition wherein the protruding portion of the second film 23 is picked up with a pickup device or the like, the second film 23 is detached by the stage being rotated in the direction opposite to that when attaching the second film 23. Next, the resin member 22 embedded in the notch portion 1a of the n⁻ type semiconductor substrate 1 is removed (step S13).

Herein, when it is possible to remove the resin member 22 embedded in the notch portion 1a of the n⁻ type semiconductor substrate 1 from the n⁻ type semiconductor substrate 1 in a condition wherein the resin member 22 is attached to the second film 23 or first film 21 when detaching the film from the n⁻ type semiconductor substrate 1 in the step of detaching the second film 23 (step S12) or a step of detaching the first film 21 (step S14), to be described hereafter, it is possible to omit step S13. The reason for this is that the step S12 or step S14 doubles as the step of removing the resin member 22 embedded in the notch portion 1a of the n⁻ type semiconductor substrate 1 (step S13).

When the resin member 22 embedded in the notch portion 1a is fixed firmly in the notch portion 1a of the n⁻ type semiconductor substrate 1, step S13 may be omitted, and the resin member 22 may be left in the notch portion 1a of the n⁻ type semiconductor substrate 1. The reason for this is that the notch portion 1a is not used when there is no need for positioning of the crystal axis orientation of the n⁻ type semiconductor substrate 1 in a step after forming the plating layers on the front surface of the n⁻ type semiconductor substrate 1. For example, in a dicing step when dicing into power semiconductor chips from the n⁻ type semiconductor substrate 1, cutting is carried out along a dicing line, meaning that the notch portion 1a is not used for positioning. Also, as the outer peripheral portion of the n⁻ type semiconductor substrate 1 is a region that is destroyed without any power semiconductor chip being formed, there is no problem with the resin member 22 remaining.

Next, the first film 21 is detached from the back surface of the n⁻ type semiconductor substrate 1 (step S14). The condition thus far is shown in FIG. 9. When using, for example, a UV film as the first film 21, firstly, the adhesive layer of the first film 21 is irradiated with UV light from the first film 21 side, thereby weakening the adhesiveness of the adhesive layer. Then, for example, by attaching another film with an adhesive layer in the vicinity of an end portion of the first film 21, and lifting up the film with the adhesive layer, the first film 21 can be easily detached together with the film with the adhesive layer. The FS type IGBT shown in FIG. 1 is completed by the above step.

In step S11, a description has been given with a case of carrying out a plating process using an electroless plating method as an example, but this is not construed as limited thereto. For example, a plating process using an electrolytic plating method may be carried out. In order to form a plating layer on the emitter electrode 6 of the n⁻ type semiconductor substrate 1 using electrolytic plating, it is necessary to cause current to flow between the emitter electrode 6 and a plating solution, with the emitter electrode 6 as a cathode (−). In order for the emitter electrode 6 to be a cathode, it is necessary for the emitter electrode 6 to be electrically connected to the negative electrode of a direct current power supply. In order to do this, firstly, an under barrier metal (UBM) layer in contact with the emitter electrode 6 is formed on the front surface of the n⁻ type semiconductor substrate 1 using a vapor deposition method, a sputtering method, or the like. The UBM layer forms an electrode for causing current to flow between the emitter electrode 6 and plating solution. It is sufficient that a titanium layer, a nickel layer, a chromium (Cr) layer, a copper (Cu) layer, or the like, is formed as the UBM layer.

Next, a resist is applied to the front surface side of the n⁻ type semiconductor substrate 1, after which the resist film is patterned, leaving the resist on a portion of the front surface of the n⁻ type semiconductor substrate 1 on which no plating layer is to be formed. Next, the first film 21 is attached over the whole of the back surface of the n⁻ type semiconductor substrate 1, that is, over the whole of the surface of the collector electrode 9. Next, the notch portion 1a of the n⁻ type semiconductor substrate 1 is filled with the resin member 22, after which the second film 23 is attached to the outer peripheral portion of the n⁻ type semiconductor substrate 1. Next, the UBM layer formed on the front surface of the n⁻ type semiconductor substrate 1 is connected to the negative electrode of a direct current power supply and electrolytic plating is carried out, thereby sequentially forming plating layers (the nickel plating layer 11, gold plating layer 12, and the like) of a desired thickness on the emitter electrode 6 of the n⁻ type semiconductor substrate 1. Next, the first and second films 21 and 23 and the resin member 22 are removed. Next, the resist film on the front surface of the n⁻ type semiconductor substrate 1 is detached, after which the UBM layer is removed by etching.

As the method whereby plating layers are formed using electrolytic plating is such that the UBM layer is formed using a vapor deposition method or a sputtering method, there is concern that the UBM layer will also be formed on the side surface of the n⁻ type semiconductor substrate 1, and become conductive with the collector electrode 9. By covering the back surface and outer peripheral portion of the n⁻ type semiconductor substrate 1 with the first and second films 21 and 23 before the electrolytic plating process, as heretofore described, the back surface and side surface of the n⁻ type semiconductor substrate 1 will not come into contact with the plating solution. Because of this, it is possible to prevent an unintentional plating layer from being formed on the collector electrode 9 due to the UBM layer being conductive with the collector electrode 9.

As it is sufficient that the step of attaching the first film 21 to the back surface of the n⁻ type semiconductor substrate 1, the step of filling the notch portion 1a of the n⁻ type semiconductor substrate 1 with the resin member 22, and the step of attaching the second film 23 to the side surface of the n⁻ type semiconductor substrate 1 are carried out any time before the electrolytic plating process, they may be carried out, for example, before the formation of the UBM layer, or before the application of the resist onto the front surface of the n⁻ type semiconductor substrate 1. However, when considering the continuity and the like of the steps carried out on the front surface side of the n⁻ type semiconductor substrate 1, it is effective when the above-mentioned steps are carried out immediately before the electrolytic plating process.

The plating layers formed on the surface of the emitter electrode 6, not being limited to the nickel plating layer 11 and gold plating layer 12, can be variously changed. For example, a plating layer formed on the surface of the emitter electrode 6 may be an electroless nickel-phosphorus alloy plating, an immersion gold plating, an electroless gold plating, an electroless nickel-palladium (Pd)-phosphorus alloy plating, an electroless nickel-boron (B) alloy plating, an electroless nickel-phosphorus-PTFE (fluorine resin) composite plating, an electroless nickel-boron-graphite (C) composite plating, an electroless copper plating, an electroless silver (Ag) plating, an electroless palladium plating, an electroless platinum (Pt) plating, an electroless rhodium (Rh) plating, an electroless ruthenium (Ru) plating, an electroless cobalt (Co) plating, an electroless cobalt-nickel alloy plating, an electroless cobalt-nickel-phosphorus alloy plating, an electroless cobalt-tungsten (W)-phosphorus alloy plating, an electroless cobalt-tin (Sn)-phosphorus alloy plating, an electroless cobalt-zinc (Zn)-phosphorus alloy plating, an electroless cobalt-manganese (Mn)-phosphorus alloy plating, an electroless tin plating, or an electroless solder plating.

Also, the nickel plating layer 11 and gold plating layer 12 may be formed not only on the surface of the emitter electrode 6 but also, for example, on the surface of the gate electrode 5. In this case, it is sufficient that the nickel plating layer 11 and gold plating layer 12 formed on the surface of the gate electrode 5 are formed using the same method as for the nickel plating layer 11 and gold plating layer 12 formed on the surface of the emitter electrode 6. Also, the nickel plating layer 11 and gold plating layer 12 formed on the surface of the gate electrode 5 may be formed simultaneously with the nickel plating layer 11 and gold plating layer 12 formed on the surface of the emitter electrode 6.

As heretofore described, according to the embodiment, it is possible to prevent plating solution from coming into contact with the back surface and side surface, on which no plating layer is to be formed, of an n⁻ type semiconductor substrate by carrying out a plating process on the front surface of the n⁻ type semiconductor substrate in a condition wherein the back surface and an outer peripheral portion of the n⁻ type semiconductor substrate are covered with first and second films respectively. Because of this, it is possible to prevent a plating layer from being unintentionally deposited on the back surface and side surface, on which no plating layer is to be formed, of the n⁻ type semiconductor substrate. Consequently, it is possible to prevent variation from occurring in a plating layer formed on the front surface side of the n⁻ type semiconductor substrate, and thus possible to stably form a plating layer on the front surface side of the n⁻ type semiconductor substrate.

Also, according to the embodiment, it is possible to prevent the side surface of the n⁻ type semiconductor substrate from coming into contact with plating solution in a plating tank, or with plating solution penetrating from a lateral direction end portion of the second film to an adhesive layer, by attaching the second film to the outer peripheral portion of the n⁻ type semiconductor substrate so as to cover from a part of the front surface of the n⁻ type semiconductor substrate to a part of the back surface thereof. Also, it is also possible to prevent the side surface of the n⁻ type semiconductor substrate from coming into contact with plating solution penetrating from a longitudinal direction end portion of the second film to the adhesive layer by attaching the second film to the outer peripheral portion of the n⁻ type semiconductor substrate so that the end portions in the longitudinal direction of the second film overlap. Also, it is possible to prevent plating solution from penetrating from between the first film and second film by attaching the second film so as to overlap with an end portion of the first film. Because of this, it is possible to prevent a plating layer from being unintentionally deposited on the side surface, on which no plating layer is to be formed, of the n⁻ type semiconductor substrate. Consequently, it is possible to prevent variation from occurring in a plating layer formed on the front surface side of the n⁻ type semiconductor substrate, and thus possible to stably form a plating layer on the front surface side of the n⁻ type semiconductor substrate.

Also, according to the embodiment, it is possible to reduce the amount of air remaining between the n⁻ type semiconductor substrate and second film by providing a resin member, or the like, in a notch portion or orientation flat portion of the n⁻ type semiconductor substrate so that the planar form of the n⁻ type semiconductor substrate is circular. Also, it is possible to further reduce the amount of air remaining between the n⁻ type semiconductor substrate and second film by attaching the second film so as to push out the air remaining between the n⁻ type semiconductor substrate and second film. Because of this, it is possible to prevent the second film from becoming detached due to the air remaining between the n⁻ type semiconductor substrate and second film expanding in a plating process subsequently carried out at a temperature of in the region of 80° C.

Also, according to the embodiment, it is possible to carry out a plating process on an inexpensive FZ substrate, without using an expensive resist. Also, it is possible to carry out a plating process on an inexpensive FZ substrate without using an expensive light permeable supporting body, as is done in JP-A-2004-64040, and there is thus no need to recycle the light permeable supporting body. Because of this, it is possible to reduce the manufacturing cost of a power semiconductor element. Consequently, it is possible to stably form a plating layer at a low cost on the front surface side of the FZ substrate.

As heretofore mentioned, as the invention is such that various changes are possible, for example, the configuration and constituent material of each portion of the semiconductor device and the constituent material of the films protecting the semiconductor substrate in the heretofore described embodiment are variously set in response to required specifications, and the like. For example, a description has been given with a case wherein an aluminum-silicon layer is formed as an emitter electrode as an example, but a nickel layer may be formed on an aluminum-silicon layer using a vapor deposition method or a sputtering method, and a plating layer formed on the surface of the nickel layer. Also, the method of pushing out the air remaining between the first and second films and the n⁻ type semiconductor substrate described in the embodiment is but one example, and various changes are possible.

Also, for example, the first film may be configured by applying a curable resin forming an adhesive layer onto the back surface of the n⁻ type semiconductor substrate, then bringing a back surface protective film into close contact with the curable resin, thereby hardening the curable resin. Also, in the embodiment, a description has been given with a case of manufacturing an FS type IGBT as an example but, this not construed as limited thereto, embodiments of the invention may also be applied to, for example, a PT IGBT, an NPT IGBT, a power MOSFET, or an FWD. Also, in the embodiment, the first conductivity type is the n-type while the second conductivity type is the p-type, but the invention is established in the same way when the first conductivity type is the p-type and the second conductivity type the n-type.

In this way, the semiconductor device manufacturing method according to the invention is useful in a power semiconductor device wherein an electrode is provided on each of the two main surfaces of a semiconductor substrate, and a plating layer is provided on the electrode provided on one of the main surfaces.

What is claimed is:

1. A semiconductor device manufacturing method whereby a plating layer is formed using a plating process on one main surface side of a semiconductor substrate, the method comprising:

forming a first electrode on one main surface side of the semiconductor substrate and forming a second electrode on the other main surface side of the semiconductor substrate;

attaching a first film to the other main surface of the semiconductor substrate after the forming the first and second electrode in order to prevent a deposition of the plating layer on the second electrode when carrying out the plating process;

attaching a second film to an outer peripheral portion of the semiconductor substrate after the attaching the first film in order to prevent a deposition of the plating layer on the outer peripheral portion of the semiconductor substrate when carrying out the plating process; and forming the plating layer in contact with the first electrode on the one main surface side of the semiconductor substrate using the plating process after the attaching the second film.

2. The semiconductor device manufacturing method according to claim 1, wherein
   in the attaching the second film, the second film is attached to the outer peripheral portion of the semiconductor substrate so as to cover from a part of the one main surface of the semiconductor substrate to a part of the other main surface thereof.

3. The semiconductor device manufacturing method according to claim 1, wherein
   in the attaching the second film, the second film is attached to the outer peripheral portion of the semiconductor substrate so that an end portion of the second film overlaps an end portion of the first film.

4. The semiconductor device manufacturing method according to claim 2, wherein
   in the attaching the second film, the second film is attached to the outer peripheral portion of the semiconductor substrate so that an end portion of the second film overlaps an end portion of the first film.

5. The semiconductor device manufacturing method according to claim 1, wherein air remaining between the other main surface of the semiconductor substrate and the first film is pushed out to the exterior after the attaching the first film or while attaching the first film.

6. The semiconductor device manufacturing method according to claim 1, wherein
air remaining between the outer peripheral portion of the semiconductor substrate and the second film is pushed out to the exterior after the attaching the second film or while attaching the second film.

7. The semiconductor device manufacturing method according to claim 1, wherein
a resin member or a solid member is provided in a notch portion or orientation flat portion indicating the crystal axis orientation of the semiconductor substrate, after the attaching the first film and before the attaching the second film, so that the planar form of the semiconductor substrate is circular.

8. The semiconductor device manufacturing method according to claim 1, wherein
the first film has heat resistance with respect to the temperature of the plating process.

9. The semiconductor device manufacturing method according to claim 1, wherein
the first film has heat resistance with respect to a temperature of 100° C. or more.

10. The semiconductor device manufacturing method according to claim 1, wherein
the second film has heat resistance with respect to the temperature of the plating process.

11. The semiconductor device manufacturing method according to claim 1, wherein
the second film has heat resistance with respect to a temperature of 100° C. or more.

12. The semiconductor device manufacturing method according to claim 1, wherein
a plurality of plating layers are stacked sequentially on the first electrode in the forming the plating layer.

13. The semiconductor device manufacturing method according to claim 1, wherein
the forming the plating layer includes at least forming a nickel layer on the first electrode using an electroless plating process or forming a nickel layer on the first electrode using an electrolytic plating process.

* * * * *